(12) United States Patent
Hultman et al.

(10) Patent No.: US 9,416,440 B2
(45) Date of Patent: Aug. 16, 2016

(54) COATING OF SUBSTRATES USING HIPIMS

(71) Applicant: CemeCon AG, Würselen (DE)

(72) Inventors: Lars Hultman, Linköping (SE);
Grzegorz Greczynski, Linköping (SE);
Werner Koelker, Herzogenrath (DE);
Oliver Lemmer, Aachen (DE); Stephan Bolz, Aachen (DE)

(73) Assignee: CemeCon AG, Würselen (DE)

( * ) Notice: Subject to any disclaimer, the term of this patent is extended or adjusted under 35 U.S.C. 154(b) by 68 days.

(21) Appl. No.: 14/348,829

(22) PCT Filed: Sep. 25, 2012

(86) PCT No.: PCT/EP2012/068887
§ 371 (c)(1),
(2) Date: Mar. 31, 2014

(87) PCT Pub. No.: WO2013/045454
PCT Pub. Date: Apr. 4, 2013

(65) Prior Publication Data
US 2014/0234616 A1    Aug. 21, 2014

(30) Foreign Application Priority Data

Sep. 30, 2011  (EP) .................................. 11183582
Mar. 1, 2012   (EP) .................................. 12157769

(51) Int. Cl.
| | |
|---|---|
| *C23C 14/06* | (2006.01) |
| *C23C 14/34* | (2006.01) |
| *C23C 14/35* | (2006.01) |
| *C23C 30/00* | (2006.01) |

(52) U.S. Cl.
CPC ......... *C23C 14/3414* (2013.01); *C23C 14/0641* (2013.01); *C23C 14/35* (2013.01); *C23C 14/352* (2013.01); *C23C 30/005* (2013.01); *Y10T 428/265* (2015.01)

(58) Field of Classification Search
USPC ................... 51/307, 309; 428/697, 698, 699;
204/192.1, 0.12, 0.15, 0.16, 298.02; 118/715
See application file for complete search history.

(56) References Cited

U.S. PATENT DOCUMENTS

| | | | | |
|---|---|---|---|---|
| 7,166,155 B2* | 1/2007 | Ishikawa | ................. | C23C 14/06 428/699 |
| 7,521,131 B2* | 4/2009 | Yamamoto | .............. | C22C 14/00 428/697 |

(Continued)

FOREIGN PATENT DOCUMENTS

| | | |
|---|---|---|
| EP | 1 422 311 A2 | 5/2004 |
| EP | 1 642 996 A2 | 4/2006 |
| EP | 1 947 209 A1 | 7/2008 |

(Continued)

OTHER PUBLICATIONS

International Search Report mailed Apr. 5, 2013, issued in corresponding International Application No. PCT/EP2012/068887, filed Sep. 25, 2012, 3 pages.

*Primary Examiner* — Archene Turner
(74) *Attorney, Agent, or Firm* — Christensen O'Connor Johnson Kindness PLLC

(57) ABSTRACT

A process and a device for coating a substrate (22) are described. In a vacuum chamber (10), a first magnetron cathode (24) is provided with a sputtering target (28) of a first metal composition comprising predominantly aluminium. A second magnetron cathode (26) is provided with a sputtering target (30) of a second metal composition comprising at least 50 at-% of a second metal selected from groups IVA-VIA of the periodic table. In order to obtain coatings with improved properties, electrical power is supplied to the cathodes (24, 26) such that the targets (28, 30) are sputtered, where electrical power is supplied to the first cathode (24) as pulsed electrical power according to high power impulse magnetron sputtering with a first peak current density, and to the second cathode (26) with a second peak current density lower than the first peak current density. The substrate (22) is arranged within the vacuum chamber such that particles from the plasma deposit onto the substrate forming a coating.

44 Claims, 10 Drawing Sheets

(56) References Cited

U.S. PATENT DOCUMENTS

Figure 1:
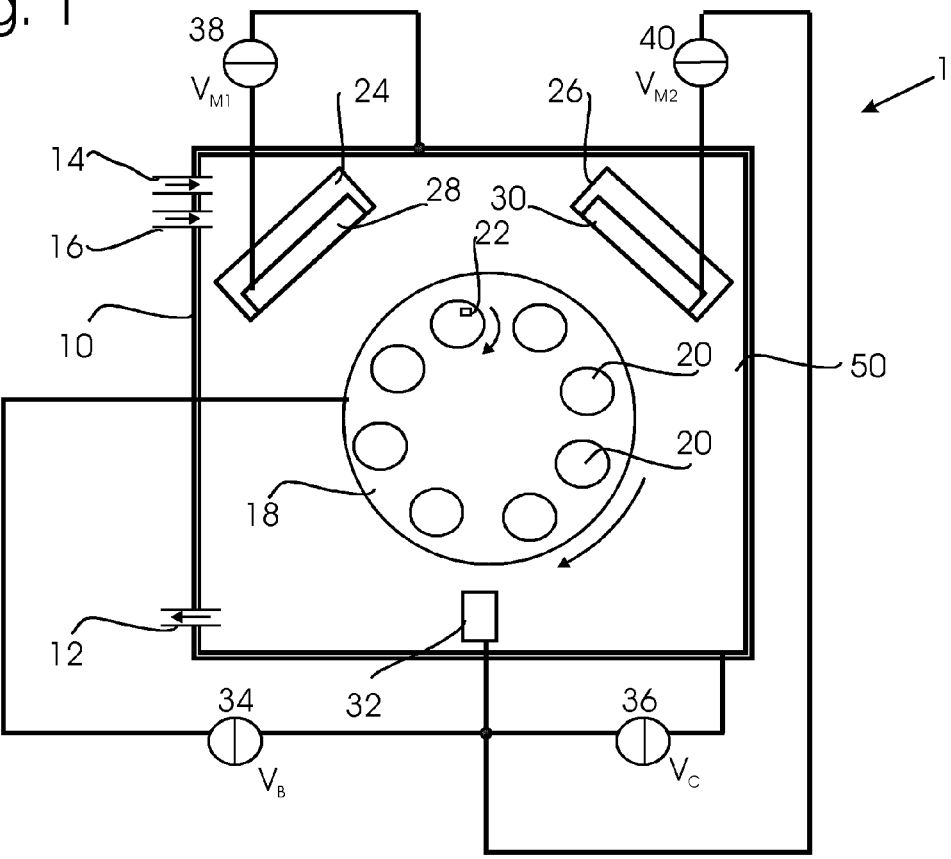

| | | | |
|---|---|---|---|
| 8,043,728 B2 * | 10/2011 | Yamamoto | B32B 15/013 428/216 |
| 8,119,262 B2 * | 2/2012 | Åstrand | C23C 14/0641 428/216 |
| 8,529,735 B2 * | 9/2013 | Kurapov | C22C 14/00 204/192.12 |
| 2009/0068450 A1 | 3/2009 | Muenz | |
| 2009/0200158 A1 * | 8/2009 | Ehiasarian | C23C 14/352 204/192.12 |
| 2011/0180389 A1 | 7/2011 | Cremer | |

FOREIGN PATENT DOCUMENTS

| | | | |
|---|---|---|---|
| EP | 2208560 | * | 7/2010 |
| JP | 2004-230515 | * | 8/2004 |
| WO | 2010/040494 A1 | | 4/2010 |

\* cited by examiner

COATING OF SUBSTRATES USING HIPIMS

The invention relates to coating of substrate by means of a physical vapor deposition (PVD) process, in particular by magnetron sputtering. More specifically, the invention relates to a process and device for coating a substrate as well as to a coated body.

In the field of PVD coating, known processes and devices for cathode sputtering provide cathodes with sputtering targets in a vacuum chamber. A plasma is generated by supplying electrical power to the cathodes, so that the targets are sputtered by ions. The sputtered material from the sputtering targets is deposited as a coating on a substrate arranged within the vacuum chamber.

For cathode sputtering, the electrical power may be supplied to the electrodes in different ways, for example as DC electrical power. It is also known to supply AC electrical power, in particular in the high frequency (HF) range. The electrical power may be supplied to the electrodes constant over time or varying. In particular, it is known to provide the electrical power in unipolar or bipolar pulses.

Recently, a sputtering process has been proposed referred to as HIPIMS (high power impulse magnetron sputtering). According to the HIPIMS process, electrical power is supplied in very short, yet extremely powerful pulses. During the resulting discharge, high current densities are reached at the targets. These pulses are supplied with relatively low duty cycle, i.e. a relatively long time period between pulses, so that the time average power is in the same range as in common DC sputtering processes.

US 2009/0068450 describes a method and an apparatus for multi-cathode PVD coating of substrates, where within a process chamber a number of magnetron cathodes are arranged. One cathode is operated according to HIPIMS, while another one of the cathodes is operated as an UBM (unbalanced magnetron) cathode. The coating materials for HIPIMS and UBM are different. In an example, CrN is deposited with HIPIMS, while TiN or NbN is deposited simultaneously by UBM. UBM can also be used to sputter multi-component materials such as TiAl, TiAlY, CrAl, ZrAl or pure graphite, so that layer sequences such as CrN/TiAlN, TiN/CrAlN or W/C are created.

It is an object of the present invention to propose a process and a device for coating a substrate, as well as a coated body, providing a deposited layer with improved properties.

This object is solved by a process according to claim 1, a device according to claim 28 and a coated body according to claim 34. Dependent claims refer to preferred embodiments of the invention.

The present inventors have considered deposition of layers of different material systems including at least aluminum and one or more further metal components. In preferred embodiments, as will be discussed below, reactive sputtering of at least aluminum and titanium with nitrogen as reactive gas is proposed. The material system Ti—Al—N and related material systems including one further metal (e.g. Ti—Al—Si—N, Ti—Al—Cr—N, etc.), two further metals (e.g. Ti—Al—Si—W—N, Ti—Al—Si—Cr—N, etc.), or more further metals is one focus of the considerations that have led to the present invention.

In the process and device according to the invention, at least two magnetron cathodes are provided in a vacuum chamber, in particular preferred as unbalanced magnetron cathodes, i.e. with an unbalanced magnet system as known per se in the art. A first cathode is provided with a sputtering target of a first metal composition and a second cathode is provided with a sputtering target of a second metal composition. Optionally, as will be explained below, further electrodes and targets with the same or different metal compositions may be present within the vacuum chamber.

The cathodes are supplied with electrical power to form a plasma where the targets are sputtered. A substrate is arranged in the vacuum chamber such that particles from the plasma deposit onto the substrate forming a coating.

According to the invention, the first and second metal compositions differ. The first metal composition consists predominantly of aluminum (Al) as a first metal. In the present context, the term "metal" refers to single type of metallic element.

In the present context, the term "predominantly" is understood such that among the metals present in a metal composition, one metal is predominant, i.e. provides the highest atomic percentage (at.-%). While it is generally possible that the targets may be provided homogeneously, e.g. as a uniform material, e.g. a compound or alloy including, besides the dominant component, other metals, it is preferred to provide targets comprising more than a single metal as plug targets, i.e. one metal as plugs inserted into a plate of the other metal.

The second metal composition comprises at least 50 at.-% of a second metal, different from the first metal. The second metal is selected from the elements of groups IV A-VI A of the periodic table, preferably selected from the group comprising titanium (Ti), zirconium (Zr), chromium (Cr), silicon (Si) and hafnium (Hf).

It is preferred that the first metal composition comprises more than 66 at.-% aluminum, further preferred more than 90 at.-%, even further preferred more than 90 at.-%. In particular, it is preferred to provide the first metal composition as Al in pure form (except for unavoidable contaminations, which will generally comprise less than 3 at.-%). As will be explained for alternative embodiments, the first metal composition may also comprise a portion of Si, such as e.g. less than 20 at.-%, preferably less than 10 at.-%.

Preferably the second metal composition comprises more than 80 at.-% of the second metal, further preferred more than 95 at.-%, and most preferred the second metal in pure form, except for unavoidable contaminations. This is particularly preferred for Ti as second metal.

During the coating process, the first and second cathodes are operated differently. The first cathode is operated with pulsed electrical power according to high power impulse magnetron sputtering (HIPIMS). The electrical power is preferably supplied in pulses of a frequency of 100-1000 Hz, further preferred 300-500 Hz. A pulse duration is preferably short, such as less than 200 ns, preferably less than 100 ns. During the pulses, a peak current density at the first target is preferably higher than $0.12 \text{ A/cm}^2$, further preferably higher than $0.24 \text{ A/cm}^2$, most preferably higher than $0.36 \text{ A/cm}^2$.

The electrical power supplied to the second electrode may be supplied e.g. as DC electrical power, as HF electrical power, or as pulsed electrical power even up to the HIPIMS range. However, in any case the first peak current density applied to the first electrode during the HIPIMS pulses is higher than the second peak current density supplied to the second electrode. In the case of pulsed electrical power, the second peak current density is measured as the maximum reached during the pulses. (In the preferred case of continuous, constant supply of electrical power, the second peak current density corresponds to the constant current density during the discharge.)

Thus, it is proposed according to the invention to provide electrical power differently to the first and second electrodes, depending on the respective target material. The present inventors have found that it is advantageous to supply high current density HIPIMS pulses to an Al target, but that e.g. a Ti, Zr, Cr, Si or Hf target should preferably be operated at lower (second) peak current density, such as preferably with DC electrical power. Bombardment with Al$^+$ ions enables deposition of coatings with high content of Al without precipitation of the second (wurtzite AlN) phase that degrades coating properties. These coatings have been found to exhibit advantageous properties such as high hardness, low stress and even hardening properties that will be discussed below.

According to an embodiment of the invention, a certain amount of Si may be present either in the first or second metal composition, or in both. It has been found that Si in the deposited layer may further increase hardness and/or oxidation resistance.

In embodiments, where the first metal is aluminum and the second metal is titanium, it is preferred that during sputtering of the first target Al$^+$ ions are generated, and that during sputtering of the second target higher ionized titanium ions i.e. Ti$^{n+}$, where n>1 are less than 10%, preferably completely avoided. The present inventors have found that coatings produced from Al$^+$ ions with little or no multiply ionized titanium ions have higher hardness.

The peak target current density supplied to the first electrode is preferably significantly above the peak target current density at the second electrode. For example, the first peak target current density may be twice or more the second peak target current density. In particular, it is preferred that the first peak target current density is above 0.12 A/cm$^2$ and that the second peak target current density is less than 0.06 A/cm$^2$.

As generally known in the art, a process gas such as argon or krypton will preferably deliver ions used for sputtering. Further, a reactive gas may be supplied to the vacuum chamber. In particular, it is preferred that the reactive gas comprises nitrogen, further preferred consists of nitrogen. Also, other reactive gases may be supplied, such as oxygen, such that sputtered metal particles react with the gas, forming e. g. nitrides or oxides to be deposited.

According to different embodiments of the invention, further electrodes may be provided in the vacuum chamber. Further cathodes may be provided with the same configuration as the first and second cathode, i.e. with the same type of electrical power supply, and with the same target configuration. In this case, the additional cathodes serve for increasing the batch size, i.e. provide, within a single vacuum chamber, a larger amount of the target material, so that a larger substrate surface may be coated. In particular, for the first cathode operated according to HIPIMS, it may be preferred in embodiments to provide at least one further magnetron cathode of the same configuration in order to compensate for the lower sputtering yield of HIPIMS operated magnetrons as compared to conventional, e.g. DCoperated magnetrons.

Alternatively or in addition, further cathodes may be provided in the vacuum chamber with a configuration differing from both the first and the second cathode. In particular, at least a third cathode may be provided with a sputtering target of a third metal composition comprising predominantly a third metal selected from the groups IV A-VI A of the periodic table, preferably from comprising Ti, Zr, Cr, Si and Hf, but different from the second metal. In the same way as the second cathode, the third cathode is also operated with a peak current density that is lower than the first peak current density. In particular, the third cathode may be operated by DC or HF electrical power with a lower (constant) current density than the peak current density generated at the first cathode.

A plurality of different electrode configurations within the vacuum chamber is possible. While, as described above, further electrodes of differing electrical configuration may be provided, it is alternatively also possible to provide electrodes of the same electrical configuration as the first or second electrode. For example, a third electrode, electrically configured in the same way as the second electrode, may comprise a target with a third metal composition that is an alloy or compound comprising elements from the second target and additionally further elements from the groups IV A-VI A of the periodic table.

Further possible electrode configurations will be discussed in relation to preferred embodiments of the invention. As visible from the examples discussed below, there may further be both additional HIPIMS and conventional cathodes provided in the vacuum chamber in different configurations. In particular, it is preferred that the vacuum chamber comprises in total 2-8 magnetron cathodes, such as preferably 6 magnetron cathodes.

In an especially preferred embodiment of the invention, the first metal is aluminum and the second metal composition comprises Ti. This is particularly preferred for reactive sputtering with nitrogen as reactive gas. For coatings with no further metals besides aluminum and titanium, in particular TiAlN, the method and device according to the invention provide particularly advantageous properties, as will become apparent in connection with preferred embodiments. Further, advantageous properties may also be achieved with TiAlN and a small addition of Cr.

In alternative embodiments, the first metal may be aluminum, the second metal titanium and there may be silicon provided as a third metal, provided as predominant metal in a third metal composition forming a sputtering target of a third cathode.

As generally known in the prior art, it is preferred to apply a bias voltage to the substrates, in particular a negative voltage to render the substrates negative relative to the plasma potential in order to attract positively charged ions from the plasma. The bias may be supplied as a DC voltage. According to a preferred embodiment, the bias may alternatively be applied as a pulsed negative bias voltage with a peak value of up to 1200 V. This value and all values of the bias voltage mentioned in the present context are given as absolute values of the voltage between the substrate and an anode, while the polarity will be such that the substrate is negative with regard to an anode, which may e.g. be a separate anode or the chamber wall. In between the bias pulses, the substrate may be disconnected from any voltage source (i.e. on a floating potential of e.g. −10V), or alternatively may be connected to a fixed bias voltage value, which may be 0 V (grounded) or may correspond to a low DC voltage of e.g. less than 80V, preferably less than 60V.

The present inventors have studied the influence of the magnitude of the bias voltage $V_B$. In the preferred case of the first (HIPIMS) electrode provided with an Al sputtering target and the second (DC) electrode provided with a Ti target, the bias voltage $V_B$ may have an absolute value of e.g. 60-200 V. The layers continue to show low residual stress up to $|V_B| \leq 160$ V, such that these values of $V_B$ are preferred. Surprisingly the hardness of the deposited films increases with increasing $V_B$, so that preferred absolute values for the bias voltage $V_B$ are 80-160 V (high hardness with low residual stress), especially preferred 80-140 V (maximum hardness with still low residual stress).

In the case of the preferred application of the bias voltage in the form of bias pulses, it is particularly preferred that the bias pulses may be synchronized with the pulses applied to the first electrode. In the present context, "synchronized" refers to pulses appearing with the same frequency and a fixed phase relation. The pulses applied to the first target and the bias pulses may be provided at the same time, or may occur before or after these, so that they are phase shifted with a time offset in between.

The present inventors have found that during the application of HIPIMS-pulses to the first electrode, the metal ions within the plasma do not appear instantaneously after the application of the pulse, but that such metal ions are generated with a delay, such that a metal-ion rich period of each HIPIMS-pulse may be identified, during which the plasma comprises a substantial amount of metal ions, in particular more metal ions (e.g. $Al^+$) than gas ions (e.g. $Ar^+$).

It is therefore preferred to apply the bias pulses such that a bias voltage is present during at least a part of the metal-ion rich period, and further preferred such that the bias pulses are applied substantially only during the metal-ion rich period, such that no or only a small part (e.g. 10% or less) of the bias pulse duration is present outside of the metal-ion rich period. If a continuous DC bias is applied, or if a pulsed bias with longer pulses, e.g. applied fully synchronously with the HIPIMS pulses at the first electrode, are applied, an increased amount of incorporation of the process gas, such as Ar, has been found in the resulting film.

Further, for the preferred case with the first electrode comprising an Al target and the second electrode comprising a Ti target, a DC bias or a pulsed bias outside of the metal-ion rich period increased a tendency of forming two-phase films, that contain a mixture of cubic TiN and Wurtzite AlN. Further, the films show higher residual compressive stresses resulting from the process gas incorporation and recoil implantation, and lower film thickness due to resputtering.

In contrast, if the bias voltage $V_B$ is applied in pulses synchronized only to the metal-ion rich period of each pulse, the amount of trapped process gas is significantly less and a dense columnar microstructure single cubic phase film is deposited with less compressive stress and a higher deposition rate because of less resputtering.

In consequence, it is proposed to apply bias pulses only with a delay after the start of the HIPIMS-pulses at the first electrode, such as after an initial period of e.g. 20-60 µs, preferably 30-50 µs, especially preferred 35-45 µs. It is further preferred, that the bias pulses are applied for a shorter pulse duration than the HIPIMS-pulses at the first electrode. For the purposes of this comparison, the pulse duration of the HIPIMS pulses may be defined as the duration during which the current is above a value of 5% of the maximum current value of the pulse. Compared with this duration, the bias pulses are applied with a shorter duration of 10-90%, preferably 30-70%, especially preferred 40-60%. By choosing a synchronization between the bias pulses and the HIPIMS pulses within thus defined limits, films with preferred properties such as single cubic phase structure, high hardness and very low process gas incorporation may be deposited.

Advantageously, the synchronized bias pulses may be applied together with specially applied, namely "cut" HIPIMS pulses. In these pulses, the pulse duration is shortened. In one embodiment, the cathode power is cut off near to or preferably at the peak current. This serves to achieve better coating properties and to avoid self-sputtering and back-sputtering which leads to a lower deposition rate.

As will be explained below, a coating deposited by the above described method and device may exhibit an alloy hardening or age hardening effect, such that its hardness increases under external influences applied after deposition, e.g. heating. Thus, it may be preferred to subject the coated substrate to a treatment to bring about the hardening effect. In particular, an annealing treatment may be applied to obtain an age hardening effect, e. g. a treatment where the coated substrate is kept at a predetermined high temperature for a specified time interval. Annealing may be performed in-situ in the coating unit during or after the coating step. Alternatively, a hardening treatment may be applied only to the outer surface of the coated substrate, such as e. g. local heating by laser treatment, induction etc. The alloy hardening/age hardening property of the deposited coating is also advantageous in cases where no particular hardening treatment is applied after deposition, but where in operation of a coated tool, e.g. for cutting, the hardening effect is caused by heat generated during this operation.

According to further preferred embodiments, substrate bodies are arranged to be moved within the vacuum chamber during deposition. In particular, substrate bodies may be arranged on a rotating support. In arrangements, where the cathodes with different composition of their sputtering targets are arranged around the rotating support, the rotation speed of the support may influence the structure of the deposited layer. Slow rotation speeds may lead to visible multilayer structures. It has been found that advantageous properties of the deposited layer may be achieved with the rotation speed of less than 3 rpm, preferred 0.2-3 rpm, further preferred 0.5-2 rpm, most preferably 1-2 rpm.

The coated body according to the invention comprises a substrate and a coating layer, which may advantageously be produced by the above described method and device. The coating layer provided on a substrate, such as a tool, made e. g. from high-speed-steel or preferably cemented carbide, may be a single coating layer. Alternatively, the coating layer may be one of a plurality of coating layers, e. g. in a multilayer configuration.

The coating layer according to the invention has a composition of $(Me_{1-x}Al_x)_{1-y}Si_yN_uG_{1-u}$. Me is one or more metal selected from groups IVA-VIA of the periodic table, preferably from the group comprising titanium, chromium, zirconium or hafnium. G is selected from boron, carbon and oxygen and present only optionally. The atomic concentrations are such that the Al content is $0.4 < x \leq 0.8$, preferably $0.5 \leq x \leq 0.75$, most preferably $0.55 \leq x \leq 0.7$, and the Si content is $0 \leq y \leq 0.2$, preferably $0 < y < 0.1$. The nitrogen proportion is chosen $u > 0.5$ and may be up to 1, such that no further component (B, C or O) is present.

According to the invention, the coating layer has a hardness of above 25 GPa, preferably above 30 GPa.

The coating layer according to the invention preferably may exhibit an alloy hardening effect. Alloy hardening refers to a special composition of the coating with solute atoms limiting dislocation motion. As a result, the coating has a higher hardness.

Further, the coating layer according to the invention may preferably exhibit an age hardening effect. Age hardening describes decomposition with time into domains that are strained to each other. Under this effect, the hardness of the layer may increase due to external influences after deposition. A corresponding effect may be achieved due to spinodal decomposition. Preferably the coating layer forms a solid solution. In particular, if the phase diagram of the components of the coating layer has a miscibility gap, and the composition of the coating is within the miscibility gap, spinodal decomposition, i.e. gradual composition gradients between domains in the same crystal (phase) may occur over time, in particular under the influence of externally applied heat. The resulting nanoscale phase separation provides an increase in the macroscopic hardness of the layer.

A corresponding application of heat after the coating may be provided in situ in a dedicated annealing treatment, or in a surface hardening treatment as discussed above. However, in particular for coated tool substrates used e. g. in cutting, the heat generated during cutting may also bring about the desired age hardening effect, i.e. under heat generated in operation, e.g. cutting, milling or other tool application directly at the coated tool surface, the structure of the coating changes to yield higher hardness.

Metastable $Ti_{1-x}Al_xN$ alloys grown with Al target powered by HIPIMS and Ti target operated in DCMS mode have a kinetic solid-solubility limit of x=0.64 and exhibit high hardness of up to 30 GPa, due to solid-solution hardening, with low residual tensile stress (0.2-0.7 GPa), all of which are difficult to achieve by either DCMS alone or by cathodic arc deposition. This is attributed to a combination of kinetically-limited growth and dynamic near-surface mixing due predominantly to $Al^+$ and $Ar^+$ ion irradiation during HIPIMS pulses (the $Al^{2+}$ flux is negligible). Since the total metal deposition between HIPIMS pulses is <<1 ML freshly-deposited material is a subject to ion bombardment. Ion mixing is facilitated by the enhanced momentum transfer from metal ions during HIPIMS. Upon application of a negative substrate bias, ion energies at the substrate may be e.g. 60-130 eV, low enough to avoid formation of significant residual ion damage.

According to preferred embodiments of the invention, for substrates, in particular tool substrates of cemented carbide, the coating layer has a low internal stress. There may be a low tensile stress below 0.25 GPa, but preferably a low compressive stress of below 1 GPa, further preferred less than 0.5 GPa, or even less than 0.25 GPa.

According to a further preferred embodiment, the coating layer has an integrated XRD peak intensity ratio $I_{111}/(I_{111}+I_{002})$ normalized to the powder diffraction data in the range 0.3-0.7, preferably 0.4-0.6, more preferably 0.45-0.55. Here, the coating is low textured or untextured and additionally shows high hardness, as visible from preferred embodiments of the invention.

According to one embodiment of the invention, the coating layer shows a 200 and/or 111 peak intensity ratio I (c-AlN)/I(c-TiAlN) of less than 0.30.

In a preferred embodiment, the coating layer is a one phase material as can be determined by conventional transmission electron microscopy and diffraction and/or by XRD investigations, and can also be derived from the analysis of the relaxed lattice parameter.

Other than coating layers produced by arc discharge PVD, a coating layer according to the invention, which is produced by sputtering, preferably has no incorporated droplets. It may be provided in different thicknesses, such as 1-8 μm, preferably 2-5 μm, most preferably 2-4 μm.

Figure 2:
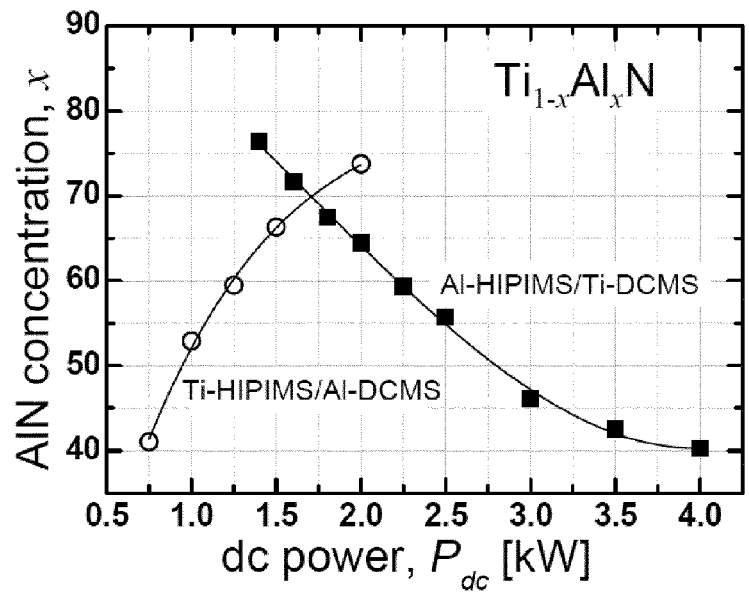
Figure 3:
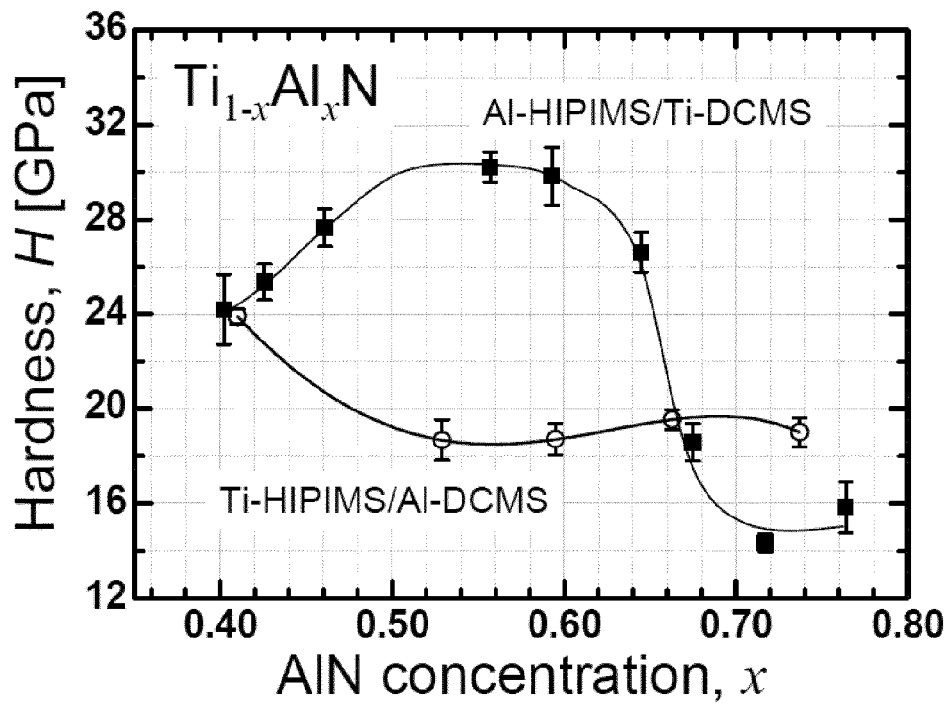
Figure 4:
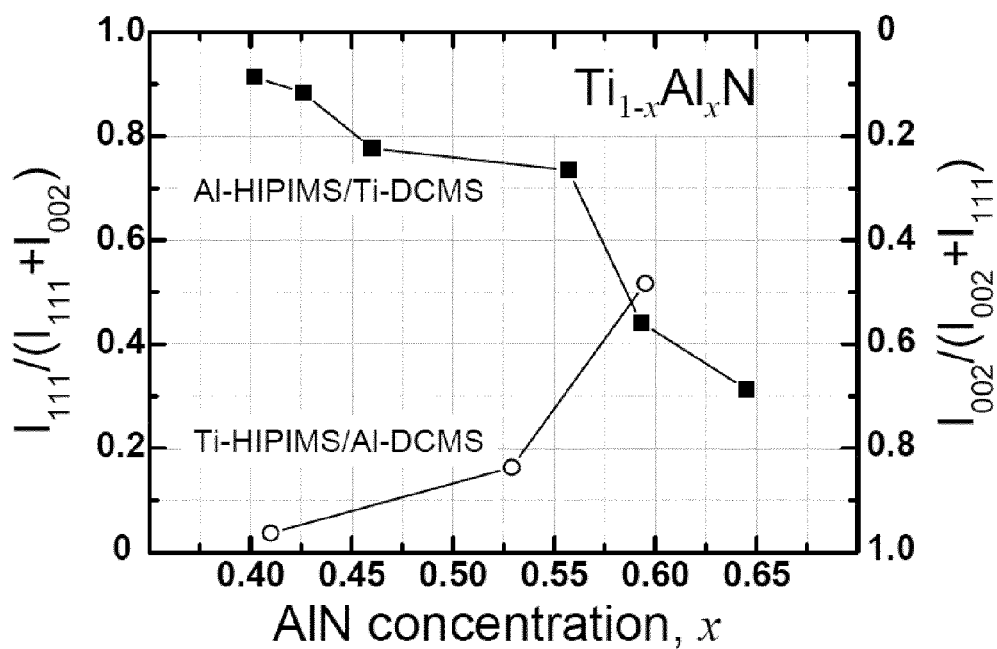
Figure 6:
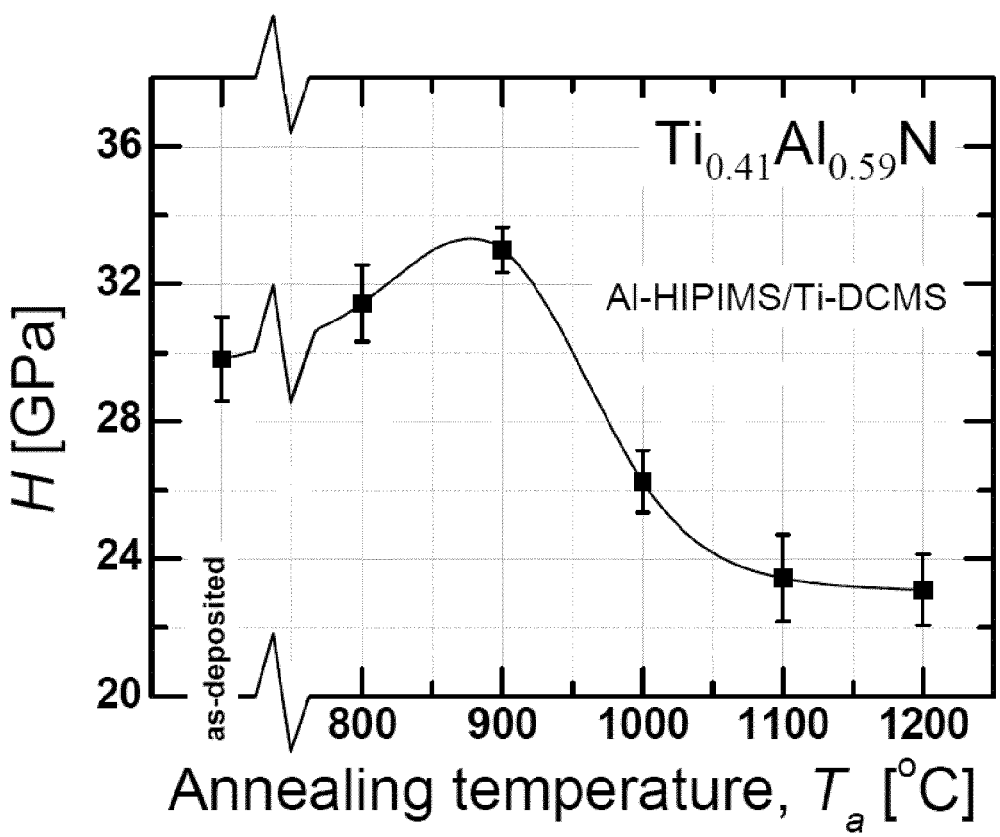
Figure 7:
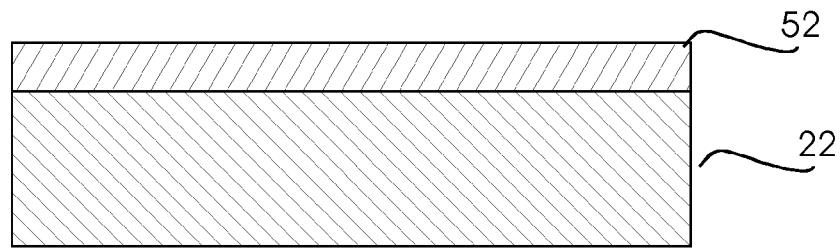
Figure 8:
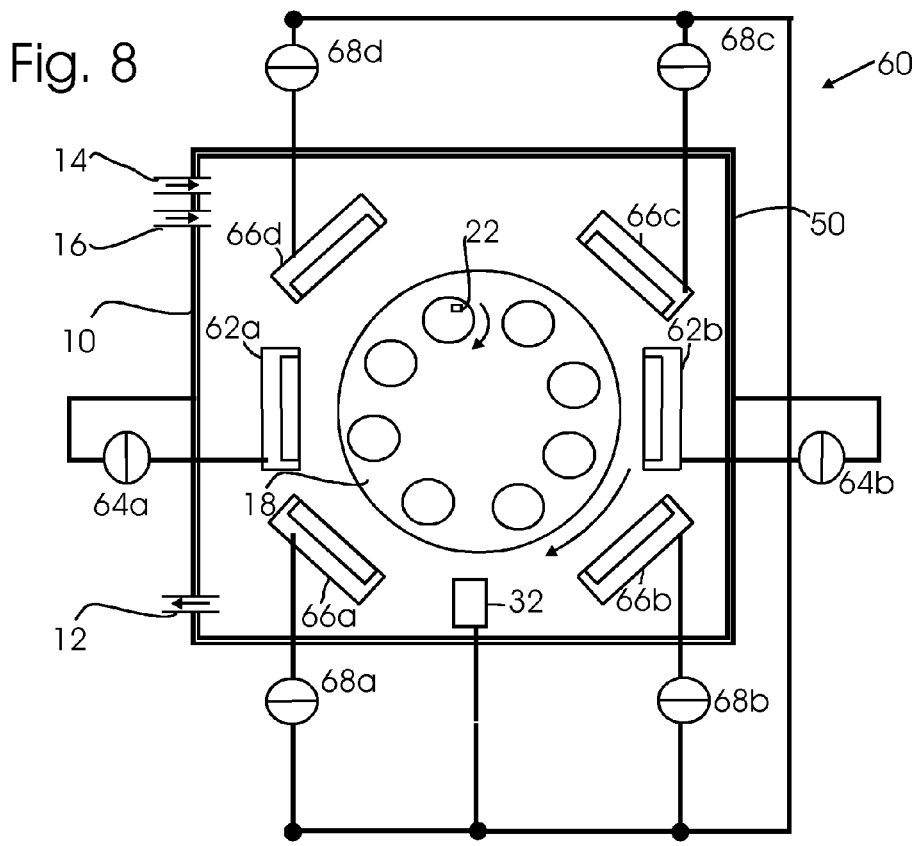
Figure 9:
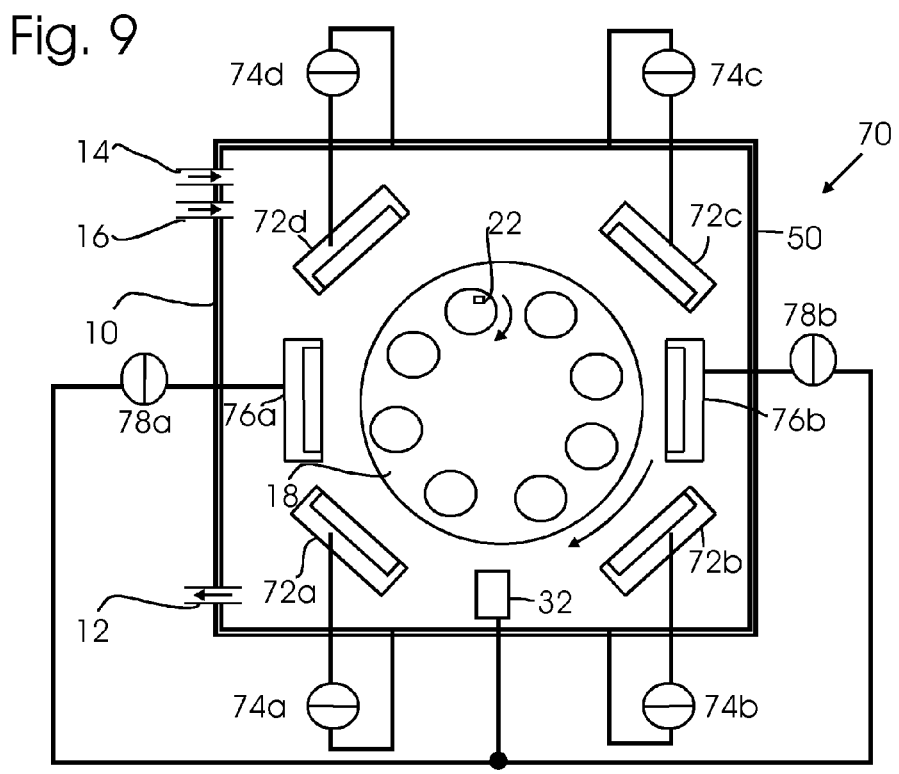
Figure 10:
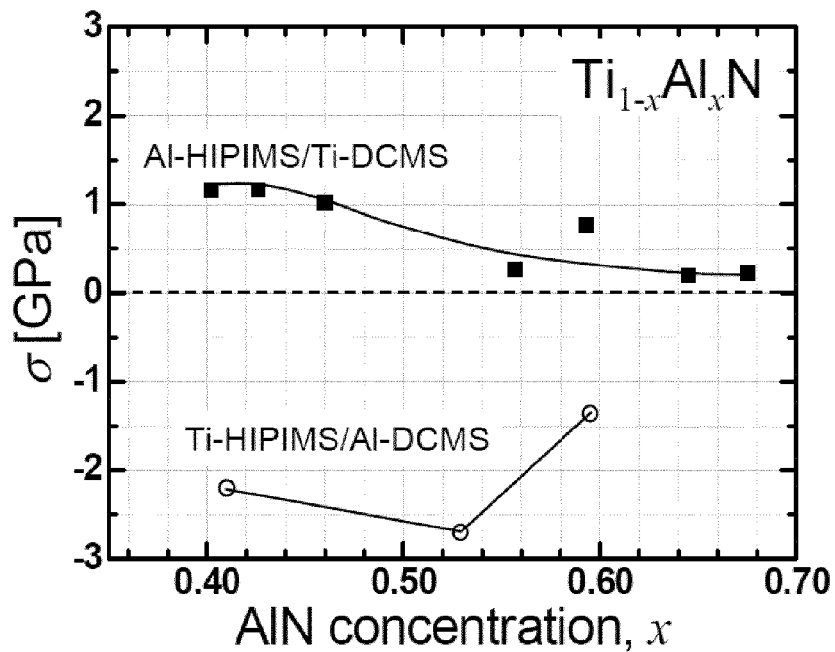
Figure 11:
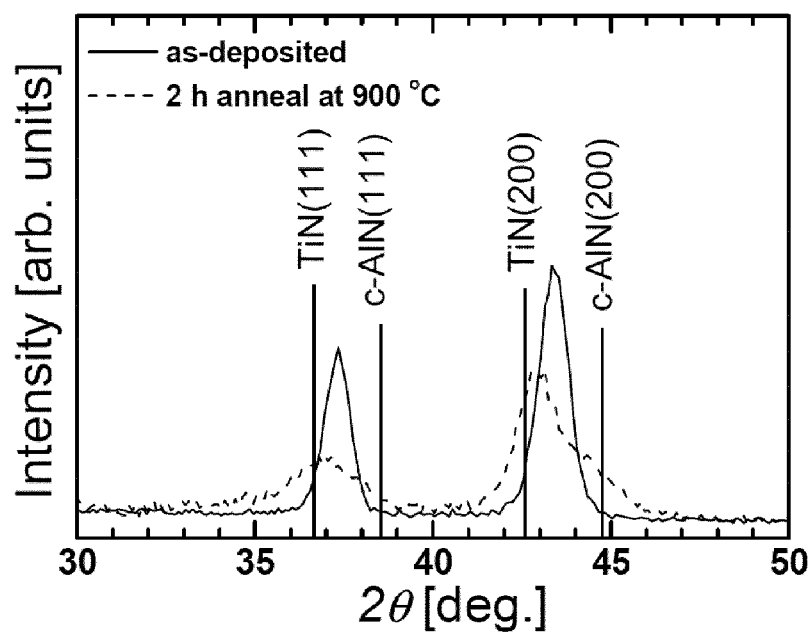
Figure 12:
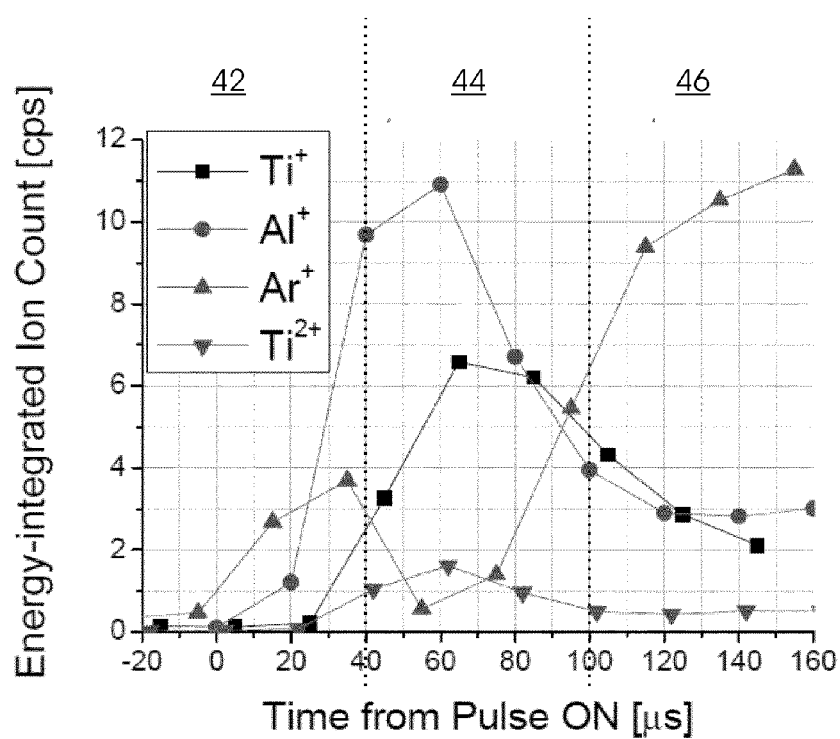
Figure 13:
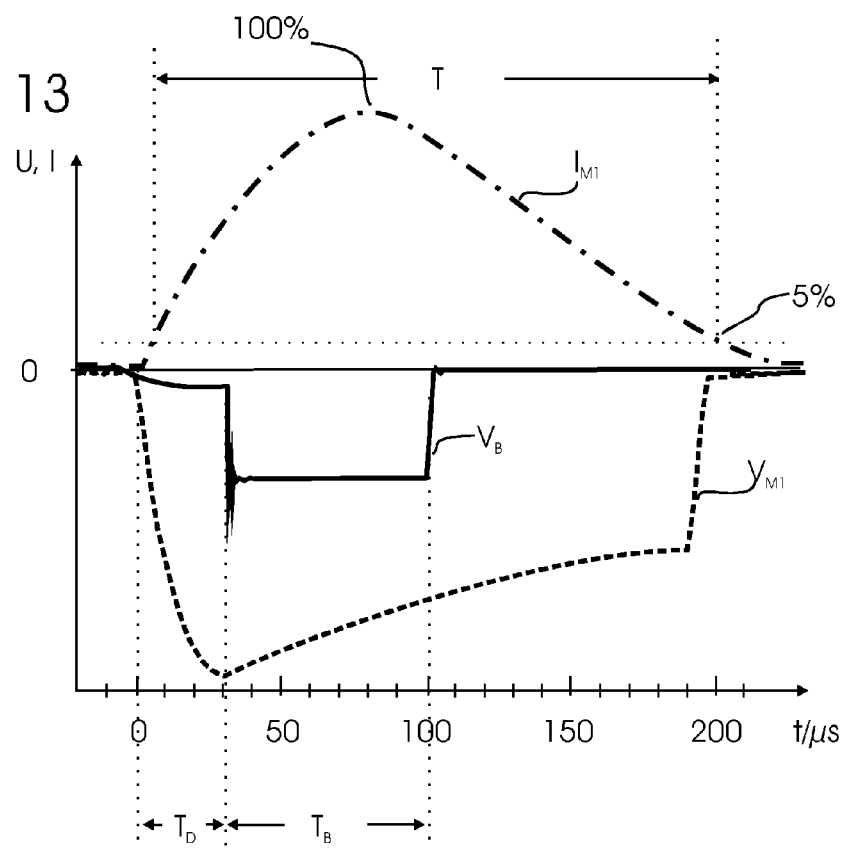
Figure 14:
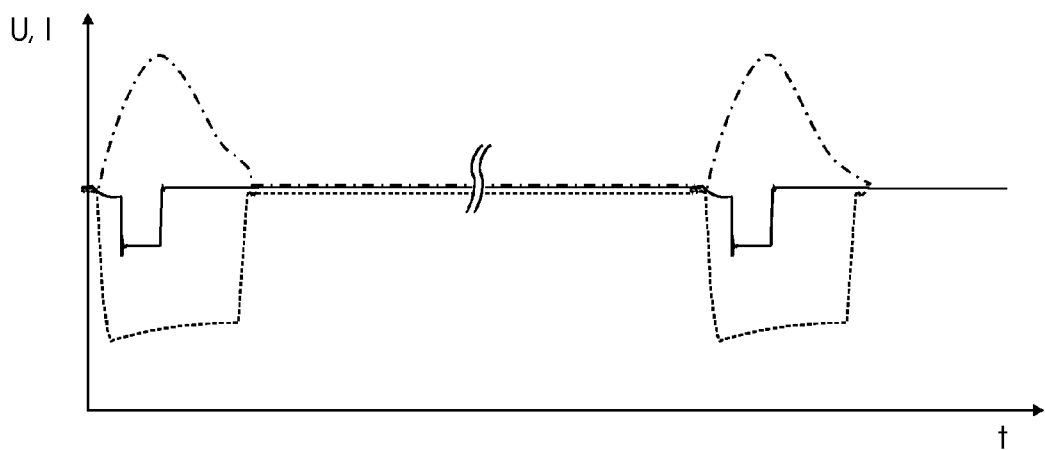
Figure 15:
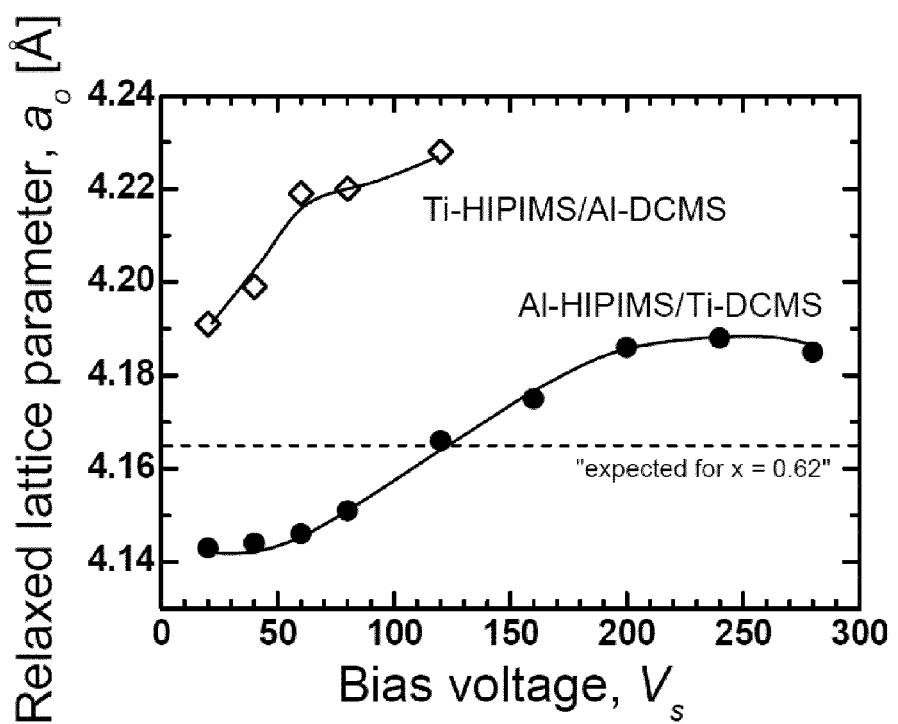
Figure 16:
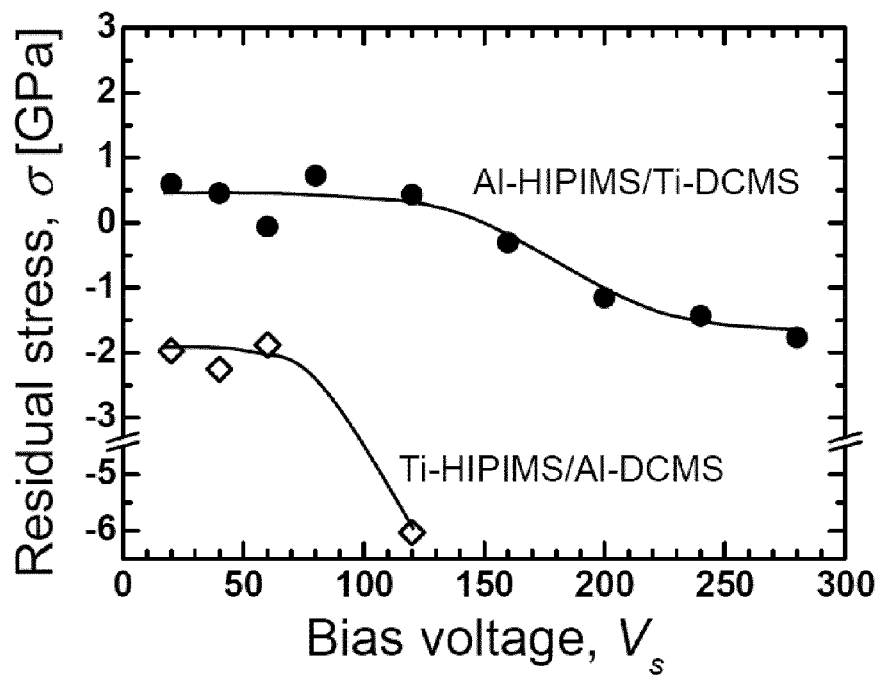
Figure 17:
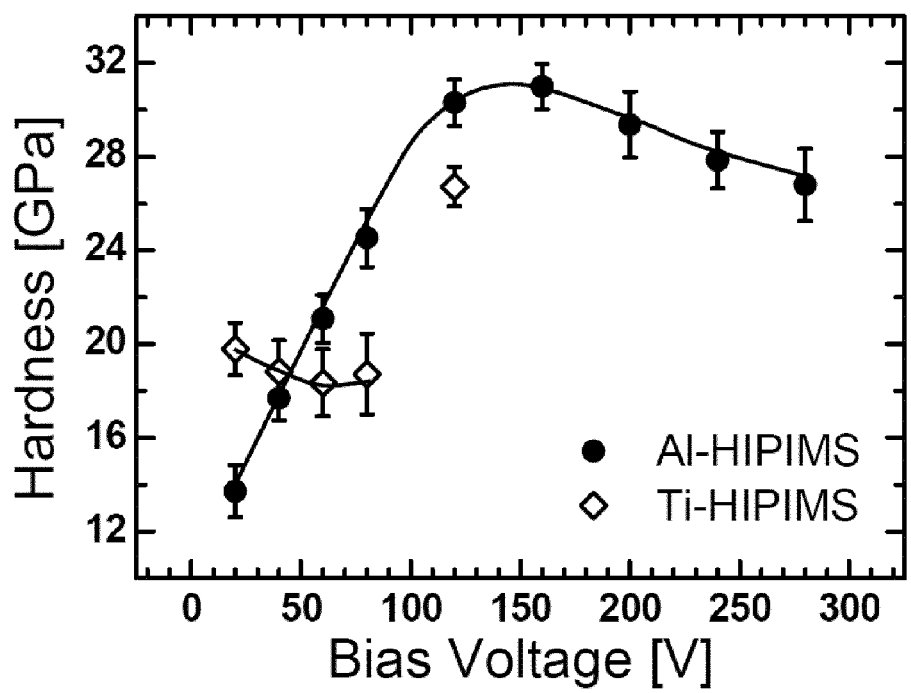
Figure 18:
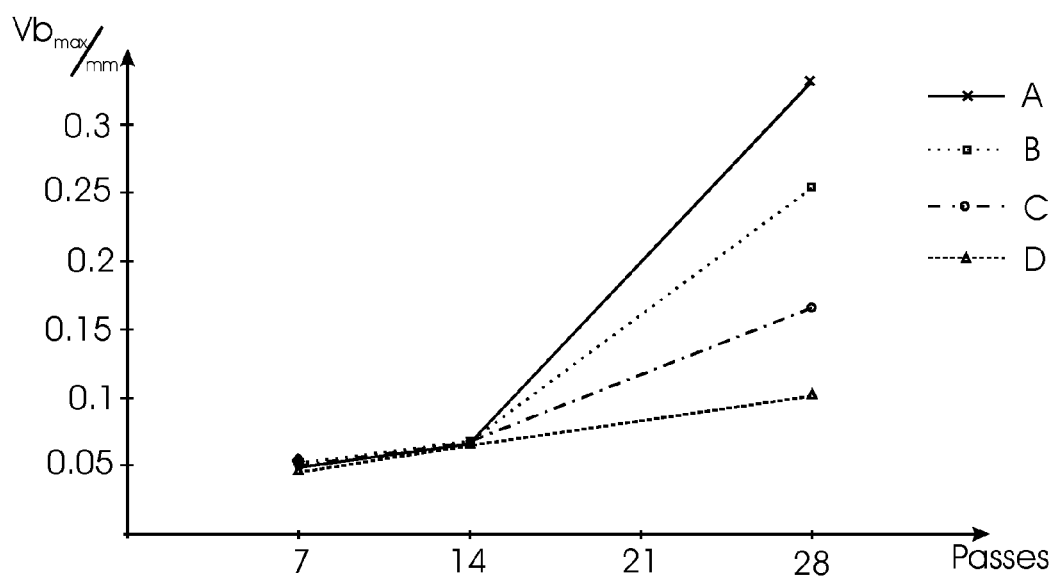

In the following, embodiments of the invention will be discussed with relation to the figures. In the figures, FIG. 1 shows a schematic representation of a first embodiment of a coating device, FIG. 2 shows a diagram of the AlN content in a coating over electrical power, FIG. 3 shows a diagram of hardness as a function of AlN content, FIG. 4 shows a diagram of a texture parameter as a function of AlN concentration, FIGS. 5a-5d show TEM images with corresponding selected area diffraction patterns for different coating layers, FIG. 6 shows a diagram of hardness obtained at different annealing temperatures, FIG. 7 shows schematically a coating layer on a substrate, FIGS. 8, 9 show alternative embodiments of coating devices, FIG. 10 shows a diagram illustrating stress evolution as a function of AlN concentration, FIG. 11 shows a diagram of an XRD spectrum before and after annealing, FIG. 12 shows a diagram illustrating the amount of different types of ions over time after the start of a HIPIMS-pulse, FIGS. 13, 14 show diagrams illustrating a pulsed bias voltage over time, FIG. 15 shows a diagram illustrating the lattice parameter a in dependence on the bias voltage, FIG. 16 is a diagram illustrating the residual stress in deposited film in dependence on the bias voltage, FIG. 17 is a diagram showing the hardness of a deposited layer in dependence on the bias voltage, FIG. 18 is a diagram showing the results of wear tests conducted on coatings obtained with different processes.

FIG. 1 shows schematically a PVD sputter coating device 1 in a top view including a vacuum chamber 10 comprising a vacuum system 12 for providing a vacuum on the inside of an electrically conductive chamber wall 50 and inlets 14,16 for a sputtering gas (preferably argon) and a reactive gas (preferably nitrogen). Within the vacuum chamber 10, a rotatable substrate table 18 with planetary rotating supports 20 is arranged. Substrate work pieces 22 of which only one is shown in FIG. 1, are arranged on the supports 20.

Further arranged within the vacuum chamber 10 next to the rotating table 18 are magnetron cathodes 26, 24. Each magnetron cathode 24, 26 comprises an unbalanced magnet system as known per se in the prior art. First magnetron cathode 24 comprises a flat rectangular sputtering target 28. A second magnetron cathode 26 comprises a sputtering target 30.

Within the vacuum chamber 10, an anode 32 is arranged. The anode 32 is electrically connected to different electrical power supplies. A bias power supply 34 for delivering a bias voltage $V_B$ is connected between the anode 32 and the substrate table 18, which is electrically conductive, such that the bias power supply 34 is also electrically connected to the individual substrate work pieces 22. The bias voltage $V_B$ is negative, i.e. sets the substrate potential to a negative value to attract positively charged ions.

A chamber wall power supply 36 is connected between the anode 32 and the electrically conductive chamber wall 50 of the vacuum chamber 10, delivering a voltage $V_C$.

Instead of using a separate anode 32, the metallic chamber wall 50 may alternatively be used as anode for some or all of the cathodes. Thus, in an alternative configuration the chamber wall power supply 36 is not present. In the embodiments shown, HIPIMS-cathodes 24 (in FIG. 1), 62a, 62b (in FIG. 8) and 74a-74d (in FIG. 9) are operated against the chamber wall 50 as cathode, whereas non-HIPIMS-cathodes are operated against a dedicated anode 32. Alternatively, it is also possible to operate HIPIMS-cathodes against a dedicated anode, and/or to operate non-HIPIMS-cathodes against the chamber wall 50.

A first magnetron power supply 38 delivering a first magnetron voltage $V_{M1}$ is connected between the first magnetron cathode 24 and the chamber wall 50. A second magnetron power supply 40 delivering a second magnetron voltage $V_{M2}$ is connected between the anode 32 and the second magnetron cathode 26. As will be explained below, the first power supply 38 is a HIPIMS supply, delivering electrical power in short pulses. The HIPIMS magnetron cathode 24 and the corresponding HIPIMS power supply 38 are configured and driven as explained in WO 2009/132822 A2, which is incorporated by a reference in its entirety. The second power supply 40 is a conventional DC power supply. The power supplies 38, 40 deliver a negative voltage to the cathodes 24, 26, relative to the anode 32.

In operation of the coating device, substrates 22 are loaded onto the rotating supports 20. A vacuum is generated within the vacuum chamber 10. Argon as a sputtering gas is supplied through the inlet 14. Electrical power is applied by power supplies 38, 40 to the magnetron cathodes 24, 26 to generate a plasma within the vacuum chamber 10.

Ions from the plasma sputter the sputtering target 28, 30. By applying a negative bias voltage $V_B$, ions from the plasma are urged onto the surface of the substrates 22 for depositing a layer. During the deposition process, nitrogen is supplied through the inlet 16 as a reactive gas.

In the coating device shown in FIG. 1, the first and second magnetron cathodes 24, 26 differ both by the composition of their respective targets 28, 30 and the electrical power supplied by the corresponding power supplies 38, 40. The first magnetron cathode 24 is equipped with a pure Al target 28. Electrical power supply 38 supplies voltage $V_{M1}$ in pulses according to HIPIMS, i.e. very short pulses leading to a discharge with an extremely high current density at the target 28.

The second magnetron target 26 is equipped with a pure Ti target 30. Electrical power is supplied to the second magnetron cathode 26 as a DC voltage $V_{M1}$.

In a first embodiment of the present invention, $Ti_{1-x}Al_xN$ films are deposited with the device of FIG. 1. Such thin films thanks to high hardness and good oxidation resistance at elevated temperatures are often used for wear protection in a whole variety of applications ranging from cutting tools to components in aerospace industry. Deposition methods that result in a high solubility of Al in a cubic TiN matrix to form metastable NaCl-type structure with no structural decomposition into wurtzite AlN are desired, as high Al content improves coating performance at elevated temperatures.

In conventional direct current magnetron sputtering (DCMS), single phase films are typically obtained for $x \leq 0.4$ at the substrate temperatures of 500° C. On the other hand solid solutions with Al molar content of up to at least $x=0.66$ can be produced by cathodic arc evaporation, but will then have droplets. The amount of Al that can be dissolved in cubic phase seems to depend among other factors also on the ionization of incident material flux, since the ion bombardment-induced mixing taking place in the surface region can effectively surpass chemical forces driving the system towards decomposition.

In this respect high power pulsed magnetron sputtering (HIPIMS), with significant ionization of sputtered material flux that is substantially higher than experienced in DCMS, is applied in the first embodiment, where the cathodes 24, 26 are provided in a hybrid HIPIMS-DCMS configuration. The first cathode 24 equipped with an elemental aluminium target is run in HIPIMS mode, i.e. operated with pulses leading to a discharge of high peak current density while the second cathode 26, equipped with an elemental titanium target is set to DCMS operation, i.e. supplied with DC electrical power. In a comparative example, the targets are interchanged, so that the electrode with the Ti target is operated in HIPIMS and the electrode with the Al target is operated in DCMS mode. In this way the effect of intense high-energy metal ion fluxes on film properties may be studied separately for Ti- and Al-ions.

According to the first embodiment, depositions of $Ti_{1-x}Al_xN$ films are performed in a coating system as shown in FIG. 1. In a first test, silicon substrates are used to study coating properties. However, in a preferred example, tool substrates 22 are coated, i.e. cutting inserts of cemented carbide are mounted as substrates 22.

For both the embodiment and the comparative example, the Al content in the coating may be controlled by varying the average power on the DCMS operated cathode while keeping the HIPIMS power constant. In the embodiment with Al-HIPIMS/Ti-DCMS configuration, HIPIMS average power at the first electrode 24 is fixed at 2.5 kW (5 J/pulse, 500 Hz, limited by arcing in reactive mode, 10% duty cycle) while DCMS power at the second electrode 26 is varied between 1.4 kW and 4 kW resulting in an Al content $0.4 \leq x \leq 0.76$. For the comparative example, the Ti and Al targets are exchanged between the electrodes 24, 26. In the resulting Ti-HIPIMS/Al-DCMS set up, a higher average HIPIMS power of 5 kW (10 J/pulse, 500 Hz, 10% duty cycle) is necessary in order to grow films in the desired compositional range, since the Ti sputter rate is approximately half of the Al rate. The DCMS power at the second electrode 26, in the comparative example equipped with an Al target, is varied from 0.75 kW (x=0.41) up to 3 kW (x=0.83).

In both the embodiment and comparative example a negative DC bias $V_B$ of 60 V is used. The $N_2$-to-Ar flow ratio is fixed at 0.2 and the resulting process pressure is 0.4 Pa. Additionally, a radiation heating (not shown) of 2×10 kW (2 hrs long heating phase) and 2×8 kW (coating phase, typically 90 min long) is used.

During coating, according to the embodiment with a Al-HIPIMS/Ti-DCMS configuration, the peak current density, i.e. the current delivered to the first electrode 24 divided by the front surface of the target 28 is 0.39 A/cm$^2$, and therefore substantially higher than the (constant) current density at the equally sized second target 30 of $\leq 0.022$ A/cm$^2$. In the comparative example with targets of the same size, the current density at the titanium target driven with HIPIMS is in peak 1.14 A/cm$^2$.

The temperature of the substrate 22 during deposition is found to be ~500° C.

FIG. 7 shows schematically a coating layer 52 provided on the substrate 22. Depending on the target power ratio, i.e. the (time average) target power supplied to the first cathode 24 operated in HIPIMS-mode divided by the (constant) electrical power supplied to the second magnetron 26 in DCMS-mode the film composition varied.

FIG. 2 shows AlN content in the film as a function of DC power for both target arrangements tested. As can be seen, the application of HIPIMS results in a severe deviation from the trend expected from the difference in sputter yield. If the Ti target is driven in HIPIMS mode (open circles), coatings with higher than expected Al content are obtained. Analogically, if HIPIMS is applied on the Al target (filled squares) the Al content in the films is lowered.

In FIG. 3, nanoindentation hardness is plotted for all $Ti_{1-x}Al_xN$ coatings as a function of AlN content in the film, both for the embodiment and comparative example. Surprisingly, whether HIPIMS is applied to the Ti or to Al target has dramatic consequences for mechanical properties. Although initially, at x=0.4, very similar hardness of 24 GPa is obtained for both configurations, data sets diverge from each other as Al concentration increases. In the embodiment with a Al-HIPIMS/Ti-DCMS configuration, hardness increases with increasing Al content to reach the maximum of 30 GPa for 0.55×0.6 and drops drastically for x>0.65.

In contrast, for the comparative example with the Ti-HIPIMS/Al-DCMS configuration, a drop in hardness to 18.5 GPa is observed already at x=0.53 and hardness remains low also for films with higher Al concentration. Eventually at x=0.67 both methods give again the same hardness.

In consequence, in the compositional range $0.55 \leq x \leq 0.6$ films prepared according to the embodiment under intense Al ion bombardment are ~65% harder than those that were prepared according to the comparative example under periodic exposure to energetic flux of Ti-ions from the HIPIMS source.

XRD analysis of the films (a set of Θ-2Θ scans with tilt angle varying between 0° and 75° in order to detect potential presence of hexagonal grains even if their crystal planes were not parallel to the sample surface) shows for the comparative example (Ti-HIPIMS/Al-DCMS configuration) films in the range 0.41≤x≤0.53 exhibit only cubic $Ti_{1-x}Al_xN$ phase. The hexagonal AlN-rich phase is first detected by XRD in the Ti0.4Al0.6N sample. The relative ratio between hexagonal and cubic phase content increases with increasing Al concentration and eventually at x=0.74 the cubic phase is not detectable by XRD. On the other hand, if HIPIMS is used on the Al target instead (Al-HIPIMS/Ti-DCMS), the solubility limit is clearly higher as exemplified by the fact that the Ti0.41 Al0.59N film from this series shows only cubic phase. The hexagonal phase in this target configuration is first detected at x=0.65, indicating that the onset for the alloy decomposition lies in the range 0.59<x<0.65, i.e., in the region where the mixing enthalpy (and thus the chemical driving force for decomposition) reaches the maximum. In the sample with the highest Al content (in this series) of x=0.77, the cubic phase can still be clearly detected by XRD (coexisting with hexagonal phase), in contrast to samples prepared with HIPIMS on the Ti target.

The evolution of a preferred orientation as a function of Al content clearly depends on the target configuration, as indicated in FIG. 4. Films from the embodiment (Al-HIPIMS/Ti-DCMS) exhibit the (iii) texture at lower Al content (0.40≤x≤0.56) that gradually evolves towards texture free (x=0.59), to eventually become (200)-textured at higher Al concentrations. The opposite trend is observed for samples made according to the comparative example (Ti-HIPIMS/Al-DCMS configuration). Films with lowest Al content show highest degree of (200) orientation, that gradually changes toward texture-free. The reliable determination of film texture could not be obtained for films in this series with x>0.6 due to overlap with signals from the hexagonal phase.

FIG. 5*a*-5*d* show analytical TEM characterization for the most representative samples.

Figure 5A:
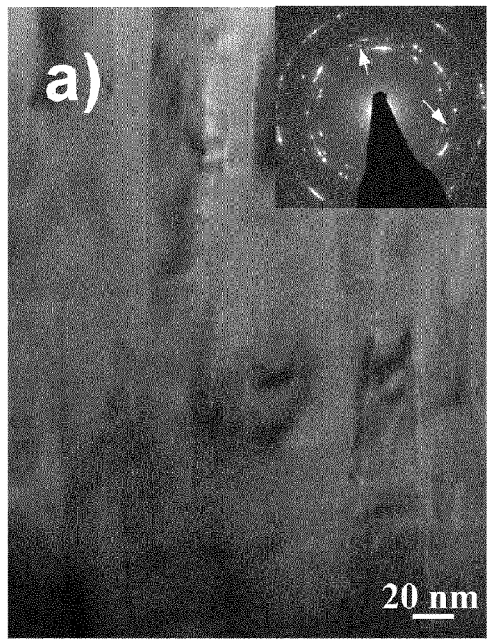
Figure 5B:
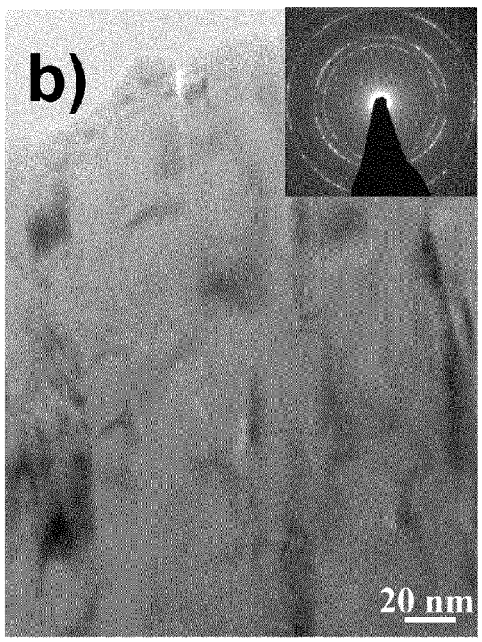

FIGS. 5*a*-*b* show overview TEM images for films deposited according to the embodiment (Al-HIPIMS/Ti-DCMS configuration) with compositions Ti0.6Al0.4N and Ti0.41Al0.59N.

Figure 5C:
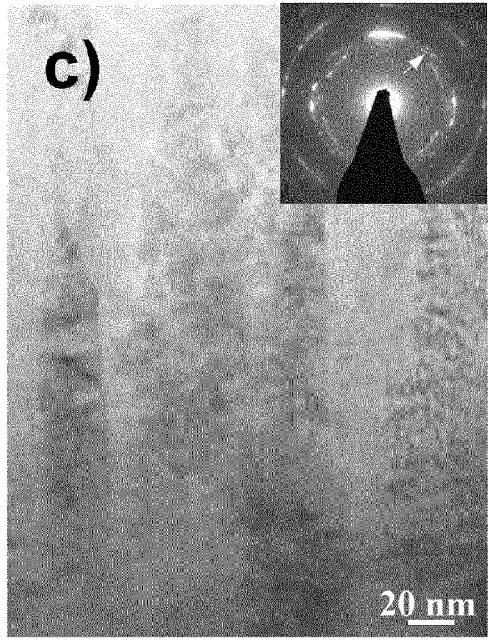
Figure 5D:
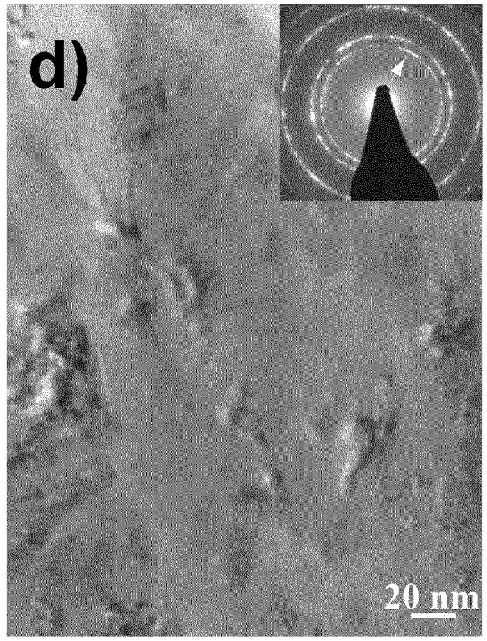

FIGS. 5*c*-*d* show a TEM sample set with two films from the comparative example (Ti-HIPIMS/Al-DCMS configuration), namely Ti0.59Al0.41N and Ti0.47Al0.53N.

All samples have a dense columnar structure with the column diameter of about 20-40 nm. The Al-HIPIMS/Ti-DCMS sample with the Al content x=0.59 has a slightly finer grain than others. Corresponding selected area electron diffraction (SAED) patterns in the inserts demonstrate that the sample according to the embodiment with x=0.4 has a strong <111> texture while the film of the comparative example with similar Al content (x=0.41) is <200>-textured, in agreement with XRD results presented above. Both films with higher Al content (FIGS. 5*b* and 5*d*) are nearly texture-free. In some of the samples, minority phases have been found as indicated by the arrows.

For samples prepared according to the embodiment, FIG. 6 shows the results of annealing tests. A sample with high (x=0.59) Al content undergoes age hardening and reaches a maximum hardness of ~33 GPa at 900° C. Contrary, for samples with lower Al content (not shown), the hardness deteriorates with rising temperatures. Tilt-angle dependent XRD performed on samples annealed at 900° C. (not shown) revealed in the case of a Ti0.60Al0.40N sample presence of hexagonal phase. The latter was also detected in the case of Ti0.41Al0.59N sample after annealing at 900° C. In this case however, highly asymmetric diffraction peaks, especially at large tilt angles, revealed formation of a cubic AlN phase predominantly in the surface region.

FIG. 11 shows how the annealing treatment affects the XRD peaks and thus illustrates spinodal decomposition. Θ-2Θ XRD measurements, carried out as a function of tilt angle ψ on Ti0.41 Al0.59N Al-HIPIMS/Ti-DCMS films annealed at 900° C. reveal that the 111 and 002 diffraction peaks from the cubic phase are highly asymmetric, especially at large tilt angles, suggesting that the cubic AlN phase is present predominantly in the near-surface region. An example is shown in FIG. 11, together with corresponding data for the as-deposited sample. Apart from the asymmetry caused by the additional contribution from the cubic AlN phase, note that the diffraction peaks from the post-annealed sample shift toward lower diffraction angles, close to that of the TiN phase, confirming the spinodal decomposition reaction path c-(Ti,Al)N→c-TiN+c-AlN.

In summary, the embodiment shows that in contrast to other sputtering techniques like DCMS or cathodic arc, HIPIMS processing does not lead to film stoichiometry that could be expected based on the target composition/configuration. This peculiar behavior is caused by the fact that power normalized deposition rate in HIPIMS is, in general, lower than for DCMS and the loss of deposition rate is element-specific.

Results presented here reveal a dramatic asymmetry between effects of energetic Al or Ti ion fluxes on the film properties, which are best exemplified by the evolution of film hardness with increasing Al concentration (cf. FIG. 3).

In conclusion, due to distinctly different composition of ion fluxes from target driven in either DCMS or in the HIPIMS mode, the effects of Al+ and Ti+ ion fluxes on properties of resulting films are quite different. Bombardment with Al+ ions according to the embodiment (Al-HIPIMS/Ti-DCMS target configuration) enables deposition of high Al content (0.55≤x≤0.6) films that exhibit high hardness (>30 GPa) and low residual stress.

According to the comparative example, coatings with corresponding Al content prepared under Ti+ metal ion flux and in particular $Ti^{2+}$ ion flux (Ti-HIPIMS/Al-DCMS configuration) show hardness in the range 18-19 GPa. Such different mechanical properties for films with similar composition result from the fact that Al solubility in TiN matrix strongly depends on the target configuration used. The results suggest that not more than 40 at % Al can be accommodated in the cubic phase under the Ti ion flux from the Ti-HIPIMS magnetron, to be compared to 64 at % Al in the case of Al-ion assistance from the Al-HIPIMS magnetron during the growth process.

The bias voltage $V_B$ applied between the anode 32 and the substrates 22 onto which the layer 52 is deposited, may be applied as DC voltage or in pulses. Surprisingly, the structure and properties of deposited layers 52 may be influenced significantly by both a specific choice of the magnitude of the bias voltage $V_B$ and of the synchronization of a pulsed bias voltage $V_B$ with the HIPIMS pulses applied to the first magnetron cathode 24. Again, surprisingly strong differences may be found between the preferred example of an aluminum target 28 mounted to the first cathode 24 and a Ti target 3*o* mounted to the second, DC-driven cathode 26, as opposed to the comparative example with interchanged target configuration.

FIG. 12 shows in a diagram the result of in-situ time-resolved ion mass spectroscopy, determining an energy-integrated ion count of individual types of ions appearing after an HIPIMS pulse which is one example of a possible pulse shape is started at t=0 μs by applying the voltage pulse $V_{M1}$ to the first cathode 24. As visible from FIG. 12, three distinguished phases 42, 44 and 46 of the HIPIMS pulse may be defined. In an initial period 42, in the example shown approximately 0-40 μs after the start of the pulse, the ions in the plasma are dominated by $Ar^+$ ions with relatively low contribution from metal ions. In a following time period, referred to as a metal-ion rich period 44 and in the example of FIG. 12 appearing at about 40-100 μs, the plasma is dominated by metal ions. In the metal-ion rich period 44, the intensity of gas ions is reduced due to rarefaction. Subsequently, in the post-metal phase 46, in the present example starting from 100 μs, the plasma is dominated by thermalized Ar ions, with also thermalized metal ions present.

Thus, within the different periods over time within each HIPIMS-pulse, different types of ions are present. While for a bias voltage $V_B$ applied continuously as a DC voltage, or for a pulsed bias voltage $V_B$ fully synchronized with the HIPIMS-pulse, i.e. appearing from the start thereof at t=0 μs, ions from all three phases 42, 44, 46 will act on the substrate 22. However, by providing a pulsed bias voltage $V_B$ synchronized only with selected ones of the above described time periods, it is possible to select the group of ions from the plasma to act on the growing layer 52.

In particular, by substantially synchronizing the bias pulses with the metal-ion rich period 44 shown in FIG. 12, where metal ions dominate, it is possible to specifically select these ions and thereby minimize effects caused by ions of the process gas, in the present case Ar.

FIG. 13 shows for an example of a single HIPIMS pulse supplied to the first cathode 24 the curves for the voltage $V_{M1}$, the current at the first cathode 24 $I_{M1}$ and a synchronized pulsed bias voltage $V_B$.

As will be appreciated by the skilled person, the magnitudes of the voltages $V_{M1}$ and $V_B$, and of the current $I_{M1}$ are not indicated in FIG. 13. For the HIPIMS pulse, the voltage $V_{M1}$ may rise up to a peak of about 2000 V, and the current $I_{M1}$ may reach a peak (100%) of about 3000 A. The voltages $V_{M1}$ and $V_B$ are not shown on the same scale.

The pulsed voltage $V_{M1}$ is applied from t=0-200 μs. The resulting current $I_{M1}$ also shows a pulse behavior. The current pulse duration T, defined as the duration during which the current $I_{M1}$ is above 5% of the maximum current value, is about 200 μs.

In the example shown, the bias voltage $V_B$ is applied as a voltage pulse of a duration $T_B$, where in the current example $T_B$=70 μs, such that $T_B$ is about 30% of T. The bias pulse is applied after a delay time $T_D$, which in the current example corresponds to 40 μs, i.e. about 20% of the pulse duration T.

FIG. 14 shows how the bias pulses are synchronized with each HIPIMS pulse. In the example shown, the HIPIMS pulses with a duration of about 200 is appear with a frequency of 400 Hz, i.e. an interval in between of about 2500 μs, i.e. with a duty cycle of 4%. Within each HIPIMS pulse interval, the bias pulses are of the same duration and appear with the same delay $T_D$ after the start of the pulse.

The bias pulse thus defined corresponds to the metal-ion rich period 44. It will be appreciated by the skilled person that the synchronization need not be complete, i.e. good results will be achieved also with a minor overlap of e.g. 10% with other periods.

In a comparison of a DC bias, a pulsed bias with bias pulses fully synchronous to the HIPIMS pulse (0-200 μs), and the preferred bias pulse shown in FIG. 13, limited to the metal-ion rich period 44 (40-100 μs after the start of the HIPIMS pulse), the films 52 deposited with the preferred, shorter bias pulse have a very low concentration of trapped Ar within the film, below the detection limit, whereas the DC bias and fully synchronous pulsed bias show a larger amount of Argon incorporated within the film. The preferred, shorter pulses produce layers with a deposited single phase NaCl structure, exhibiting a dense columnar microstructure. On the contrary, continuous DC or fully synchronized bias lead to films showing a tendency for two-phase structure, containing a mixture of cubic TiN and wurtzite AlN, with relatively high concentration of trapped Ar and high residual compressive stresses resulting from Ar incorporation and recoil implantation. Further, resputtering is lower in the case of bias pulses synchronized to the metal-ion rich period, so that deposition rates are increased.

It should be mentioned that the pulse shape of a HIPIMS pulse as shown in FIG. 13 is only one example of such a pulse. In a HIPIMS power supply for a HIPIMS cathode, the pulse is preferably obtained by connecting a charged capacitor to the cathode, such that the capacitor discharges over the gap between cathode and anode. If the capacitor is fully discharged, a pulse shape as represented in FIG. 13 may occur.

However, the pulse shape may be modified. In particular, it may be preferred to reduce the time duration of the HIPIMS pulse. As shown in FIG. 12, the metal ion rich period lasts up to about 100 μs after the start of the pulse. Therefore, it is advantageous to cut off the pulse (i.e. disconnect the capacitor) after a specific period such as e.g. 100 μs. This still allows to obtain the advantageous metal ion rich period 44, while avoiding the later period 46 with a higher concentration of ions of the working gas. The "cut" (i.e. forcibly ended) pulse further has the advantage of less self sputtering at the HIPIMS cathode.

Particularly preferred is a combination of a synchronized bias pulse and a cut, i.e. shortened HIPIMS pulse. The HIPIMS pulse, once the avalance effect responsible for the rise of metal ions (see Al-ions in FIG. 12) is working, succeeds to produce a cloud of ions in front of the HIPIMS cathode. A synchronized bias pulse which starts with a delay after the start of the HIPMS pulse (e.g. 10-50 μs), and which is applied synchronously to the metal ion rich period 44 but turned on afterwards succeeds to accelerate the ion cloud formed in front of the HIPIMS cathode onto the substrate.

As FIG. 15 shows, the magnitude of the bias pulse has an influence on the lattice parameter $a_o$, measured in A. For (pulsed) bias voltages $V_B$<120 V, the lattice parameter $a_o$ is lower than expected for the aluminum content x=0.62, whereas films prepared at $V_B$>120 V show $a_o$ higher than expected. The comparative example with the titanium target mounted to the first (HIPIMS) electrode, shows a different behavior with strong variations already at low bias voltages.

FIG. 16 shows the residual stress σ, measured in GPa. As shown, the layer exhibits low residual stress for $V_S$≤160 V. At $V_S$>200 V, the compressive stress is larger than −1 GPa. In contrast, for the comparative example, films show high compressive stress even at low bias voltages.

FIG. 17 shows the significant influence of the magnitude of the bias voltage $V_B$ on the indentation hardness, measured in GPa. For the preferred example with the aluminum target mounted to the HIPIMS electrode 24, the hardness of the film increases with increasing $V_B$ to reach about 30 GPa in the interval of 120 V≤$V_B$≤160 V. In the comparative example with a titanium target mounted to the HIPIMS electrode 24, the hardness is significantly lower and does not exceed 20 GPa.

In consequence, a preferred bias voltage $V_B$ would be supplied in pulses of a magnitude of −80-140 V for a duration synchronized with the metal-ion rich phase 44, i.e. in the example 30 shown from t=40 μs to t=100 μs.

FIG. 18 shows the evaluation of wear tests conducted on substrates coated with Ti—Al—N layers.

Shown is the maximum wear width VBmax over the number of passes of a wear member over the coated surface for coatings obtained with different bias. Curve A, shown as a solid line, corresponds to a comparative example obtained with a Ti-HIPIMS/Al-DC electrode configuration and shows significant wear, in particular after 28 passes.

Curve B represented as a dotted line corresponds to a coating obtained with an Al-HIPIMS/Ti-DC electrode configuration with −60V pulsed bias, synchronized over the full 0-200 μs duration of the HIPIMS pulse. This sample, as well as curve C (Al-HIPIMS/Ti-DC with DC bias, shown as a slash-dotted line) shows improved wear behavior over the comparative example.

The lowest wear width is obtained for curve D, corresponding to a coating obtained in Al-HIPIMS/Ti-DC electrode configuration with −120V pulsed bias synchronized only to the metal-ion rich period of 40-100 μs after the start of each HIPIMS pulse.

While the first embodiment of a coating device according to FIG. 1 with no more than two electrodes may be used to produce the coating 52 on the substrate 22, it is preferred to provide more than two cathodes in devices for coating substrates 22 on an industrial scale.

As a second embodiment, FIG. 8 shows a coating device 60 corresponding to the coating device of FIG. 1, but with a different electrode configuration. Likewise, FIG. 9 shows a third embodiment. Except for the electrode configuration, i.e. type and arrangement of power supplies as well as targets provided at the cathodes, the coating devices of FIGS. 8 and 9 are identical to the first embodiment shown in FIG. 1. In particular the bias power supply has been omitted in FIG. 8, FIG. 9 for clarity reasons only.

In the second embodiment according to FIG. 8, four conventionally DC-powered magnetron cathodes 66a, 66b, 66c, 66d are provided within the chamber 10, each with a DC power supply 68a, 68b, 68c, 68d connected to the anode 32. Two HIPIMS cathodes 62a, 62b are provided, each with an HIPIMS power supply 64a, 64b connected to the chamber wall 50.

In the following, examples for target configurations in the embodiments of FIG. 8, FIG. 9 and corresponding operation will be discussed. Examples of such configurations are listed in the following table, where for each of the six cathodes the targets material and type of operation (DC or H=HIPIMS) is indicated.

|  | Example 1 | Example 2 | Example 3 | Example 4 |
|---|---|---|---|---|
| Configuration | FIG. 8 | FIG. 8 | FIG. 8 | FIG. 9 |
|  | 62a: AlSi-H | 62a: Al-H | 62a: Al-H | 76a: TiAl-DC |
|  | 62b: Cr-H | 62b: Cr-H | 62b: Al-H | 76b: TiAl-DC |
|  | 66a: TiAl-DC | 66a: TiAl-DC | 66a: Ti-DC | 72a: Cr-H |
|  | 66b: TiAl-DC | 66b: TiAl-DC | 66b: Al-DC | 72b: AlSi-H |
|  | 66c: TiAl-DC | 66c: TiSi-DC | 66c: Ti-DC | 72c: Al-H |
|  | 66d: TiAl-DC | 66d: TiSi-DC | 66d: TiAl-DC | 72d: AlSi-H |
|  | Example 5 | Example 6 | Example 7 | Example 8 |
| Configuration | FIG. 8 | FIG. 8 | FIG. 8 | FIG. 8 |
|  | 62a: Al-H | 62a: Al-H | 62a: Al-H | 62a: Al-H |
|  | 62b: Cr-H | 62b: Cr-H | 62b: Cr-H | 62b: Al-H |
|  | 66a: TiAl-DC | 66a: TiAl-DC | 66a: Ti-DC | 66a: Ti-DC |
|  | 66b: TiAl-DC | 66b: TiAl-DC | 66b: TiAl-DC | 66b: TiAl-DC |
|  | 66c: TiAl-DC | 66c: Ti-DC | 66c: Ti-DC | 66c: Ti-DC |
|  | 66d: TiAl-DC | 66d: TiAl-DC | 66d: TiAl-DC | 66d: TiAl-DC |
|  | Example 9 | Example 10 | Example 11 | Example 12 |
| Configuration | FIG. 8 | FIG. 9 | FIG. 8 | FIG. 8 |
|  | 62a: Al-H | 76a: Ti-DC | 62a: Al-H | 62a: AlSi-H |
|  | 62b: Cr-H | 76b: Ti-DC | 62b: Si-H | 62b: W-H |
|  | 66a: Si-DC | 72a: Al-H | 66a: Ti-DC | 66a: TiSi-DC |
|  | 66b: TiAl-DC | 72b: AlSi-H | 66b: TiAl-DC | 66b: TiAl-DC |
|  | 66c: TiAl-DC | 72c: AlSi-H | 66c: TiAl-DC | 66c: TiSi-DC |
|  | 66d: Si-DC | 72d: Al-H | 66d: TiAl-DC | 66d: TiAl-DC |

According to a first example shown in the table, the four conventional magnetron cathodes 66a-66d are each equipped with Ti—Al targets, i.e. aluminum targets with Al inserts in the shape of plugs. The first HIPIMS magnetron cathode 62a is equipped with a compound target of 80% Al and 20% Si. The second HIPIMS cathode 62b is provided with a Cr target.

In operation, first etching of the substrates 22 is performed by only using the second HIPIMS magnetron cathode 62b operated in HIPIMS mode. In the following coating process, all six cathodes are operated simultaneously.

During sputtering, Ar is supplied as process gas, and nitrogen as reactive gas. The resulting coating layer 52 is a $(Ti_{1-x}Al_x)_{1-y-z}Si_yCr_zN$ layer with z<0.1. As for all following examples also, the individual composition parameters x, y depend on the relative amounts of the element within the targets and on the relative power supplied to the cathodes.

In a second example shown in the table, in the cathode configuration 6o according to FIG. 8, the first HIPIMS-magnetron cathode 62a is equipped with a pure Al target and the second HIPIMS magnetron cathode 62b is equipped with a Cr target. Of the four conventional cathodes, the first and second magnetron cathodes 66a, 66b are equipped with a TiAl plugged target and the remaining magnetron cathodes 66c, 66d are equipped with TiSi compound targets. Operation is performed by first sputter etching using the second HIPIMS electrodes 62b with Cr target, and subsequently coating using all six electrodes in simultaneous operation while supplying nitrogen as reactive gas. The resulting coating layer 52 is a $(Ti_{1-x}Al_x)_{1-y-z}Si_yCr_zN$ coating.

In a third example shown in the table for the configuration 60 of FIG. 8, the first and third conventional electrodes 66a, 66b are equipped with Ti targets, whereas the remaining conventional magnetron cathodes 66b, 66d are supplied one with an Al target and the other with a Ti—Al target. Both HIPIMS magnetron cathodes 62a, 62b are supplied with an elemental Al target. Nitrogen is supplied as reactive gas. The resulting coating layer 52 has a composition of $(Ti_{1-x}Al_x)N$.

In a fourth example shown in the table, the configuration 70 of FIG. 9 is used. The conventional magnetron cathodes 76a, 76b are both equipped with a Ti—Al plugged target. Of the HIPIMS cathodes 72a-72d, the second and fourth cathodes 72b, 72d are equipped with an Al—Si target, while the first magnetron cathode 72a carries a Cr target and the third magnetron cathode 72c carries an Al target. Coating layers 52 resulting from operation under addition of nitrogen as reactive gas are $(Ti_{1-x}Al_x)_{1-y-z}Si_yCr_zN$ layers.

Common between these configurations is in each case that a first electrode is operated in HIPIMS mode and comprises predominantly Al, preferably as a pure Al target or as Al—Si target. In contrast, cathodes with targets comprising predominantly Ti are not operated with HIPIMS. In this way, the advantageous properties of Al-ions serve to obtain a coating layer with the desired properties, whereas $Ti^{2+}$ ions are avoided.

In alternative configurations, further non-metal elements such as C, B, and/or O may be added, either as reactive gas (e.g. oxygen) or as constituents of the target material.

The above illustration and description of embodiments of the invention is to be considered illustrative or exemplary and not restrictive; the invention is not limited to the disclosed embodiments. The mere fact that certain measures are recited in mutually different embodiments does not indicate that a combination of these measured cannot be used to advantage. For example, while details of the pulsed bias voltage synchronized with a metal-ion rich period of the HIPIMS-pulse has been described for the first example with a pure Al target driven by HIPIMS and a pure Ti target driven in DC mode, both the preferred magnitude of the bias voltage and the synchronization of bias pulses to the ion-metal rich portion are also preferred for other embodiments, such as different electrode configurations.

The invention claimed is:

1. A process for coating a substrate, comprising
providing at least two magnetron cathodes in a vacuum chamber,
wherein a first cathode has a sputtering target of a first metal composition comprising predominantly aluminum as a first metal and
a second cathode has a sputtering target of a second metal composition comprising at least a 50 at.-% portion of a second metal selected from groups IV A-VI A of the periodic table,
generating a plasma in said vacuum chamber by supplying electrical power to said cathodes such that said targets are sputtered,
wherein said electrical power is supplied to said first cathode as pulsed electrical power according to high power impulse magnetron sputtering with a first peak current density, and
wherein said electrical power is supplied to said second cathode with a second peak current density lower than said first peak current density, and
arranging said substrate in said vacuum chamber such that particles from said plasma deposit onto said substrate forming a coating.

2. The process according to claim 1, wherein said second metal is selected from the group comprising titanium, zirconium, chromium and hafnium.

3. The process according to claim 1, wherein said metal composition of said first sputtering target comprises more than 66 at.-% of aluminum in pure form except for unavoidable contaminations.

4. The process according to claim 1, wherein said metal composition of said second sputtering target comprises more than 66 at.-% of said second metal in pure form except for unavoidable contaminations.

5. The process according to claim 1, wherein said electrical power is supplied to said second cathode as DC electrical power with a constant current density lower than said first peak current density.

6. The process according to claim 1, additionally comprising
providing at least a third cathode in said vacuum chamber, wherein said third cathode has a sputtering target of a third metal composition,
said third metal composition comprising predominantly a third metal selected from groups IV A-VI A of the periodic table, wherein said second and said third metal are different, and
supplying electrical power to said third cathode with a third peak current density lower than said first peak current density.

7. The process according to claim 1,
wherein said first metal is aluminum and said second metal is titanium, and
wherein at least a third cathode is arranged within said vacuum chamber, said third cathode comprising a sputtering target of a third metal composition comprising silicon.

8. The process according to claim 1, wherein a reactive gas is supplied to said chamber, such that sputtered metal particles react with said gas.

9. The process according to claim 8, wherein said reactive gas comprises nitrogen.

10. The process according to claim 1, wherein a plurality of substrate bodies are arranged within said vacuum chamber, and said substrate bodies are moved through said vacuum.

11. The process according to claim 1, wherein said electrical power is supplied to said first cathode in pulses of a frequency of 100-1000 Hz.

12. The process according to claim 1, wherein said electrical power is supplied to said first cathode in pulses with a pulse duration of less than 200μs.

13. The process according to claim 1, wherein
said electrical power is supplied to said first cathode in pulses and said pulses have a peak target current density of more than $0.12 A/cm^2$, and
said electrical power is supplied such that said second cathode has a peak target current density of less than $0.06 A/cm^2$.

14. The process according to claim 1,
wherein said first metal is aluminum and said second metal is titanium, and
wherein during sputtering of said first target, Al+ ions are generated, and
during sputtering of said second target, ions $Ti^{n+}$ with n> 1 are less than 10% of the metal flux to the substrate.

15. The process according to claim 1, wherein a negative bias voltage ($V_B$) is applied to said substrates.

16. The process according to claim 15, wherein said bias voltage ($V_B$) has an absolute value of 60-200V.

17. The process according to claim 15, wherein said bias voltage ($V_B$) is applied in bias pulses.

18. The process according to claim 17, wherein said bias pulses are synchronized with said pulses applied to said first cathode.

19. The process according to claim 17,
wherein during the application of said pulses to said first cathode a metal-ion rich period occurs and said plasma comprises a substantial amount of metal ions, and
wherein said bias pulses are applied synchronously with at least a part of said metal-ion rich period.

20. The process according to claim 19, wherein said bias pulses are applied only during said metal-ion rich period.

21. The process according to claim 17, wherein said bias pulses are applied to start with a delay after the start of said pulses applied to said first cathode.

22. The process according to claim 21, wherein said bias pulses are applied to start after an initial period of 20-60μs after the start of said pulses applied to said first cathode.

23. The process according to claim 22, wherein said initial period is 30-50μs.

24. The process according to claim 17, wherein said bias pulses are applied for a shorter pulse duration ($T_B$) than said pulses applied to said first cathode.

25. The process according to claim 24,
wherein said duration ($T_B$) of said bias pulses is 10-90% of a duration (T) of said pulses applied to said first cathode, and
wherein said duration (T) of said pulses applied to said first cathode is defined as the duration during which the current ($I_{M1}$) is above 5% of the maximum current value.

26. The process according to claim 25, wherein said duration of said bias pulses ($T_B$) is 30-70% of said duration (T) of said pulses applied to said first cathode.

27. The process according to claim 25, wherein said duration of said bias pulses ($T_B$) is 40-60% of said duration (T) of said pulses applied to said first cathode.

28. The process according to claim 15, wherein said bias voltage ($V_B$) has an absolute value of 80-160V.

29. The process according to claim 15, wherein said bias voltage ($V_B$) has an absolute value of 80-140V.

30. The process according to claim 1, further comprising subjecting said coated substrate to an annealing treatment to obtain an age hardening effect.

31. A device for coating a substrate, comprising
a vacuum chamber,
at least two magnetron cathodes arranged within said vacuum chamber, including
a first cathode having a sputtering target of a first metal composition comprising predominantly aluminum, and
a second cathode having a sputtering target of a second metal composition comprising predominantly a second metal selected from groups IV A-VI A of the periodic table,
power supplies connected to said first and second cathodes for applying electrical power to create a plasma sputtering said targets, said power supplies comprising
first electrical power supply is connected to said first cathode, said first electrical power supply configured to supply pulsed electrical power according to high power impulse magnetron sputtering with a first peak current density, and
a second electrical power supply is connected to said second cathode, said second electrical power supply configured to supply electrical power with a second peak current density lower than said first peak current density, and a substrate holder arranged in said vacuum chamber for holding said substrate such that particles from said plasma deposit onto said substrate forming a coating.

32. The device according to claim 31, further comprising
a pulsed bias power supply for providing a bias voltage ($V_B$) to said substrates in bias pulses, and
a control unit coupled to said pulsed bias power supply to synchronize said bias pulses with said pulses supplied to said first cathode.

33. The device according to claim 32,
wherein during the application of said pulses to said first cathode, a metal-ion rich period occurs during which said plasma comprises a substantial amount of metal ions, and
wherein said bias pulses are applied during at least a part of said metal-ion rich period.

34. The device according to claim 32, wherein said bias pulses have a voltage level ($V_B$) of an absolute value of 60-200V.

35. The device according to claim 32, wherein said control unit controls said pulsed bias power supply to start said bias pulses after an initial period of 20-60μs after the start of said pulses applied to said first cathode.

36. The device according to claim 32, wherein said bias pulses are applied for a shorter pulse duration ($T_B$) than said pulses applied to said first cathode.

37. The device according to claim 32, wherein said bias voltage ($V_B$) has an absolute value of 80-160V.

38. The device according to claim 32, wherein said bias voltage ($V_B$) has an absolute value of 80-140V.

39. The process according to claim 1, wherein said metal composition of said first sputtering target comprises more than 90 at.-% of aluminum.

40. The process according to claim 1, wherein said metal composition of said first sputtering target consists of aluminum in pure form except for unavoidable contaminations.

41. The process according to claim 1, wherein said metal composition of said second sputtering target comprises more than 90 at.-% of said second metal in pure form except for unavoidable contaminations.

42. The process according to claim 1, wherein said metal composition of said second sputtering target consists of 100% of said second metal in pure form except for unavoidable contaminations.

43. The process according to claim 1, wherein said electrical power is supplied to said first cathode in pulses of a frequency of 300-500 Hz.

44. The process according to claim 1, wherein said electrical power is supplied to said first cathode in pulses with a pulse duration of less than 100μs.

* * * * *